US005420752A

United States Patent [19]

Variot

[11] Patent Number: 5,420,752
[45] Date of Patent: May 30, 1995

[54] GPT SYSTEM FOR ENCAPSULATING AN INTEGRATED CIRCUIT PACKAGE

[75] Inventor: Patrick Variot, San Jose, Calif.

[73] Assignee: LSI Logic Corporation, Milpitas, Calif.

[21] Appl. No.: 110,281

[22] Filed: Aug. 18, 1993

[51] Int. Cl.6 .............................................. H05K 7/20
[52] U.S. Cl. ..................................... 361/709; 29/855;
174/52.2; 257/675; 257/718; 264/272.17;
361/723; 437/219
[58] Field of Search ................. 29/827, 841, 848, 855;
425/116, 117; 264/272.11, 272.17; 437/207,
209, 214, 215, 217, 219, 220; 165/80.3, 185;
174/52.2, 52.4; 257/667, 670, 675, 676, 706,
707, 718, 787; 361/813, 706, 764, 767, 772, 774,
776, 702, 704, 703, 709, 718–720, 722, 723

[56] References Cited

U.S. PATENT DOCUMENTS

| | | | |
|---|---|---|---|
| 3,622,419 | 11/1971 | London | 156/242 |
| 3,706,840 | 12/1972 | Moyle | 174/52.2 |
| 3,930,114 | 12/1975 | Hodge | 174/52.2 |
| 4,701,999 | 10/1987 | Palmer | 437/211 |
| 4,902,606 | 2/1990 | Patraw | 430/314 |
| 5,091,341 | 2/1992 | Asada | 437/212 |
| 5,252,783 | 10/1993 | Baird | 174/52.2 |

Primary Examiner—Gerald P. Tolin

[57] ABSTRACT

The present invention provides a method for fabricating an integrated circuit package, as well the resulting integrated circuit package, which retains a heatsink in close communication with a mold cavity. This precludes any encapsulant from flowing between the heatsink and the inner surface of a mold cavity. As a consequence, the bottom of the heatsink is not encapsulated and is thus exposed. This is accomplished by including posts, attached to the leadframe assembly, which have the function of exerting a downward force on a leadframe assembly and, in turn, on the heatsink. Tie bars, which are nonfunctional parts of a leadframe assembly, can be utilized as posts by bending the posts into an upright position.

5 Claims, 5 Drawing Sheets

GPT SYSTEM FOR ENCAPSULATING AN INTEGRATED CIRCUIT PACKAGE

FIELD OF INVENTION

The present invention generally relates to a method and system for fabricating an integrated circuit package, and more particularly to a method and system for precluding encapsulants from forming upon the intended external surface of a heatsink during encapsulation.

BACKGROUND OF THE INVENTION

Improved methods for miniaturization of integrated circuits have permitted the integration of millions of transistor circuit elements into a single silicon embodied circuit. Such a circuit is typically referred to as an integrated circuit chip or semiconductor die.

Semiconductor dies are created from a silicon wafer through the employment of various etching, doping and depositing steps that are well known in the art. Ultimately, the semiconductor die may be packaged by forming an encapsulant around the semiconductor die so as to form an "integrated circuit package" having a variety of pin-out or mounting and interconnection schemes. Plastic is often advantageously utilized as an encapsulant.

Integrated circuit packages that utilize plastic as an encapsulant are less expensive than other packaging options and provide performance and reliability that is acceptable for a number of different applications. Although plastic integrated circuit packages are more susceptible to external influences than ceramic or metallic packaging, they account for approximately 80% of the integrated circuit packages manufactured worldwide.

Integrated circuit packages come in a variety of configurations. For example, Dual-In-Line ("DIP") packaging provides an integrated circuit package having dual parallel rows of leads extending from the bottom for connection and mounting to an underlying printed circuit board. As a further example, Quad Flat Pack ("QFP") packaging provides an integrated circuit package having leads that extend from all four sides of the package. It follows that QFP integrated circuit packages permit a higher number of leads when compared to DIP integrated circuit packages. More compact packages of integrated circuits, which allow greater density on a printed circuit board, include Single-In-Line ("SIP") packaging, Pin Grid Array ("PGA") packaging, and Small Outline ("SO") packaging.

A semiconductor die is comprised of many interconnected transistors and associated passive circuit elements that perform one or more functions. These functions may be random access memory ("RAM"), central processing ("CPU"), communications, etc. Different types of semiconductor dies are employed to create a machine such as a personal computer. Combining semiconductor dies requires electrically connecting semiconductor dies with one another, as well as to devices such as keyboards, video monitors and printers. In order to accomplish these connections, conductive paths must be made available to connect a semiconductor die to external electrical circuits.

An array of electrical conductors called a "leadframe assembly" forms the conductive paths between a semiconductor die and external circuitry for facilitating interconnection therebetween. The leadframe assembly consists of a set of leadframe fingers. On one end, each leadframe finger is connected to the semiconductor die. For instance, in the case of a lead-on-chip package, each leadframe finger is designed to align with and connect to one of a series of connection pads that are located on the face of a semiconductor die. These connection pads are the points at which all input and output signals, as well as power and ground connections, are made for the semiconductor die to function as designed.

The lead tips of the leadframe assembly, being external to the integrated circuit package and extending from the leadframe fingers, are further connected to external circuitry such as a printed wiring board or another substrate. Alternatively, the lead tips of an integrated circuit package may be connected to an intermediate package such as a hybrid circuit or a multiple chip module. Hybrid circuits are typically ceramic substrates with thick- or thin-film metallization, while multichip modules utilize either ceramic or silicon substrates with built-up multilayer dielectric insulators and metal conductors to achieve the required system performance.

A heatsink is ordinarily provided beneath a semiconductor die. A heatsink functions to dissipate the heat generated by the semiconductor die. To aid in the dissipation of heat, integrated circuit packages can be fabricated to expose one or more surfaces of the heatsink from the integrated circuit package. An exposed surface of the heatsink is referred to as the "external surface" of the heatsink. In other words, it is advantageous for a surface of a heatsink to not be covered by encapsulant.

In order to avoid encapsulant from forming over the external surface of a heatsink, the external surface must be kept in close communication with the mold cavity in which the heatsink is placed. Current encapsulating processes rely on liquid plastic viscosity and the gravity of the heatsink to preclude any movement of the heatsink while inside the mold cavity. Gravity forces the external surface of the heatsink to make contact with the inner surface of the mold cavity. In doing so, gravity attempts to act as a sealing force. However, a poor sealing consistency has resulted from reliance on the weight of a heatsink. This is so since the hydraulic forces induced by the encapsulant can offset the gravity force. The hydraulic forces tend to displace the heatsink and leadframe assembly inside the mold cavity. As a consequence, encapsulant often infiltrates between the external surface of the heatsink and the inner surface of the mold cavity. Such encapsulant is referred to as "plastic flash" and "bleed". As a result, additional assembly steps are now necessary to remove the unwanted encapsulant from the external surface of the heatsink.

Other disadvantages are encountered by relying upon the force of gravity and viscosity of the encapsulant to expose the surface of a heatsink. First, in order for gravity to be applied correctly, the external surface of a heatsink must face downward when encapsulation takes place. This has the effect of significantly eliminating flexibility in the assembly process. Second, damage to a semiconductor die and its fragile internal connections can occur when the semiconductor die is displaced within a mold cavity.

In sum, typical integrated circuit packages that the applicant is aware of are unable to adequately preclude encapsulant from forming on the intended external surface of a heatsink. Rather, the viscosity of the encapsulant and the weight of the semiconductor die and heatsink are relied upon. Such reliance can, and often times does, result in the accumulation of unwanted encapsulant on the external surface of the heatsink. Thus, the prior art that the applicant is aware of fails to provide a satisfactory manner of fabricating an integrated circuit package having a heatsink with an external surface, without undertaking additional steps to remove encapsulant from the portion of the heatsink that is desired to be exposed.

SUMMARY OF THE INVENTION

The present invention overcomes the aforementioned deficiencies by providing a method and system of fabricating an integrated circuit package that substantially precludes encapsulant from covering the surface of the heatsink that is desired to be exposed. Accordingly, an object of the present invention is to provide a manner of encapsulating a semiconductor die and leadframe assembly while exposing a heatsink surface.

Another object of the present invention is to provide a method and system of fabricating an integrated circuit package wherein mold flash and bleed are reduced.

Still another object of the present invention is to simplify and enhance the assembly process of an integrated circuit package by avoiding additional processing steps relating to the removal of mold flash and bleed from the external surface of a heatsink.

A further object of the invention is to prevent the displacement of a heatsink and semiconductor die during encapsulation.

Another object of the present invention is to avoid reliance upon the force of gravity to attempt to retain a heatsink in close communication with the inner surface of a mold cavity by requiring the external surface of a heatsink to be facing downward during encapsulation.

The present invention accomplishes these objects, in addition to other objects that will be described in the drawings and detailed specification below.

In accordance with the present invention, a leadframe assembly is disposed over a heatsink. A semiconductor die is also disposed over the heatsink by placing the semiconductor die in the opening of the leadframe assembly. Tie bars, which are ordinarily part of the leadframe assembly, are bent substantially perpendicular to the leadframe assembly and away from the heatsink. The extended tie bars form a set of tie bar posts.

When a mold cavity is formed around the leadframe assembly, as well as the semiconductor die and heatsink, the tie bars engage one inner surface of the mold cavity so as to bias the leadframe assembly against the heatsink. As a result, a surface of the heatsink is kept in close communication with the opposite inner surface of the mold cavity. In other words, the force exerted by the tie bar posts ensures that there is no room between the heatsink and the mold cavity. As a consequence, when encapsulant is injected into the mold cavity, it will not flow between the heatsink and the mold cavity. Rather, the encapsulant will flow above the lead frame assembly and semiconductor die, and adjacent to the heatsink. Accordingly, an external heatsink surface is provided.

In accordance with another aspect of the present invention, the force exerted by the tie bar posts is increased. This increased force is achieved when the height of the tie bar posts exceeds the distance between the inner surface of the mold cavity and the leadframe assembly. Thus, when a mold cavity is formed, the tie bar posts are springingly biased against the leadframe assembly. Such increased bias is then further applied to the heatsink so that the external surface of the heatsink is kept in close communication with an inner surface of the mold cavity.

Other and further objects, features and advantages will be apparent from the following description of a presently preferred embodiment of the invention, given for the purpose of disclosure and taken in conjunction with the accompanying drawings.

BRIEF DESCRIPTION OF THE DRAWINGS

The foregoing and other objects, aspects and advantages of the present invention will be better understood from the following detailed description of the preferred embodiment of the invention with reference to the accompanying drawings, in which.

DETAILED DESCRIPTION OF THE PREFERRED EMBODIMENT OF THE PRESENT INVENTION

Ordinarily, a leadframe assembly includes a set of tie bars. A tie bar is typically 0.15 of a millimeter in thickness. Tie bars are a nonfunctional part of the leadframe assembly. This is so since heatsinks have now replaced the center paddle of the leadframe. Thus, the heatsink acts as the paddle and is attached to each lead finger of the leadframe assembly. Previously, tie bars were utilized to align the leadframe assembly with the center paddle. By employing tie bars to prevent the external surface of a heatsink from being encapsulated, the preferred embodiment of the present invention avoids the exercise of additional processing steps.

Figure 1:
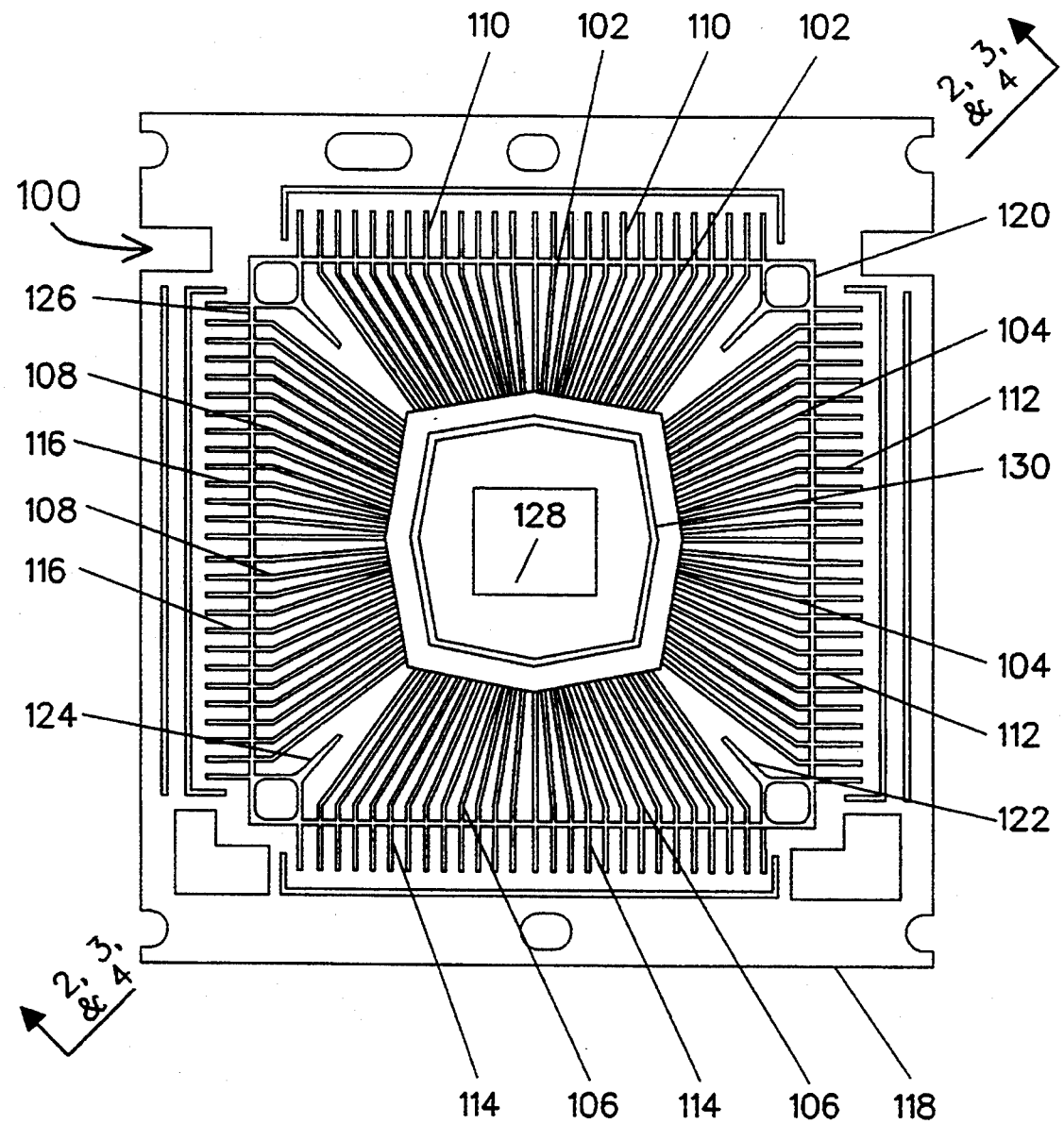
FIG. 1 illustrates a top view of a leadframe assembly having tie bars in accordance with a preferred embodiment of the present invention.

Referring to FIG. 1, a leadframe assembly is illustrated. Leadframe assembly 100 is enclosed within leadframe strip 118. Leadframe assembly 100 is designed for employment within a quad flat pack ("QFP") integrated circuit package. A QFP integrated circuit package contains four sets of leadframe fingers and corresponding lead tips. Accordingly, the integrated circuit package has leadframe fingers which extend from the top side of leadframe assembly 100. These leadframe fingers are indicated by reference numerals 102. The leadframe fingers which extend from the bottom side of leadframe assembly 100 are indicated by reference numerals 106. The leadframe fingers that extend from the sides of leadframe assembly 100 are indicated by reference numerals 104 and 108.

Beneath leadframe assembly 100 is a heatsink as indicated by reference numeral 128. Leadframe fingers 102, 104, 106 and 108 form an opening that is indicated by reference numeral 130. A semiconductor die (illustrated in FIGS. 2–4) is placed within opening 130 so as to be seated above heatsink 128. The semiconductor die is thus in thermal communication with heatsink 128. Each leadframe finger of leadframe assembly 100 extends to a lead tip for connection with external circuitry. Specifically, leadframe fingers 102, 104, 106, and 108 have corresponding lead tips indicated by reference numerals 110, 112, 114, and 116, respectively.

Leadframe assembly 100 includes four tie bars as denoted by reference numerals 120, 122, 124, and 126. Tie bar 120 is located between leadframe fingers 102 and 104. Tie bar 122 is located between leadframe fingers 104 and 106. Tie bar 124 is located between leadframe fingers 106 and 108. Finally, tie bar 126 is located between leadframe fingers 108 and 110.

In accordance with the preferred embodiment of the present invention, tie bars 120, 122, 124, and 126 are bent upward. That is, the tie bars are positioned perpendicular to leadframe assembly 100, yet away from heatsink 128. This is best seen by reference to FIG. 2.

Figure 2:
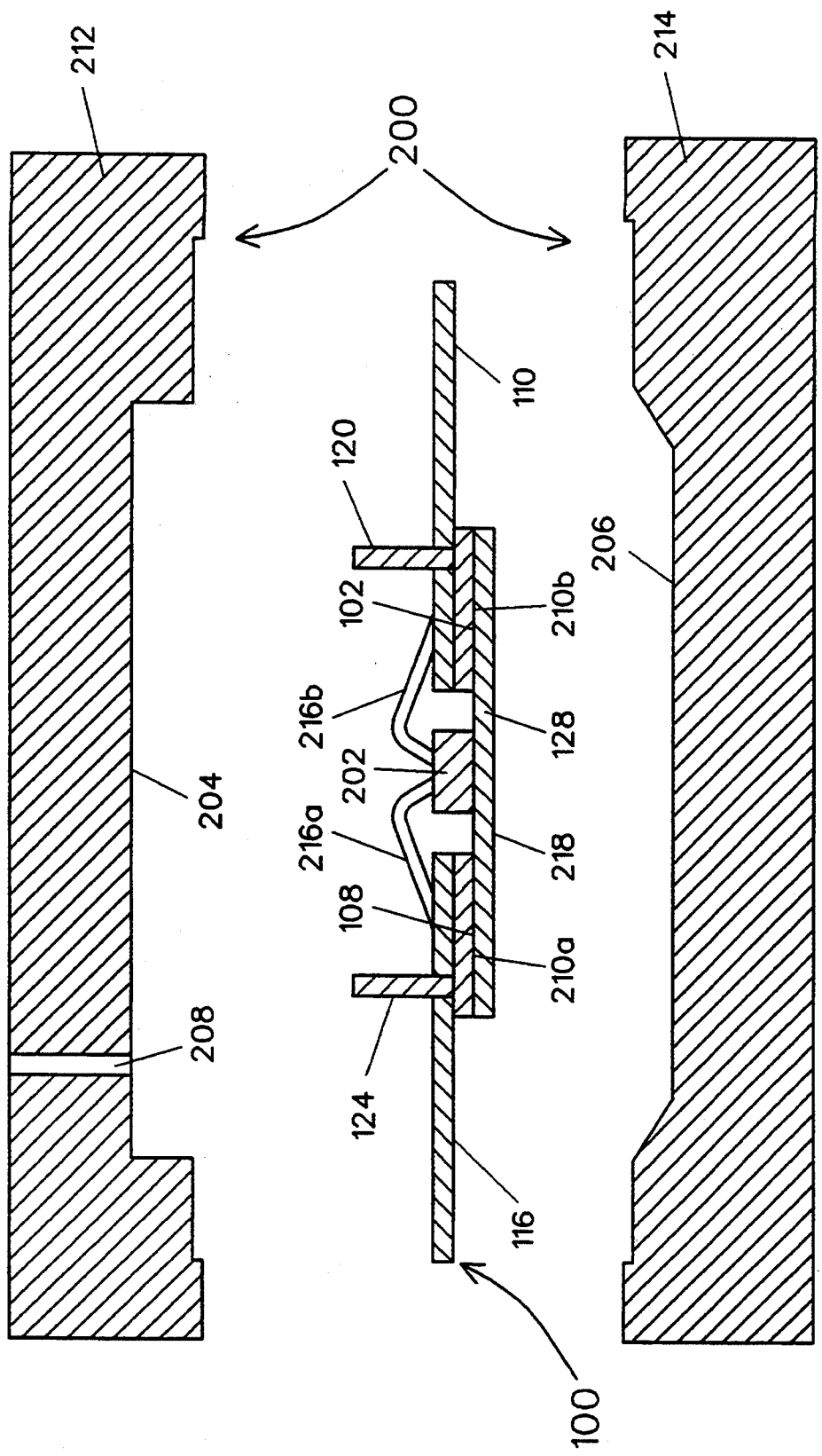
FIG. 2 illustrates a cross-sectional view of a semiconductor die, a heatsink and a leadframe assembly prior to enclosure within a molding assembly, in accordance with a preferred embodiment of the present invention.

Referring to FIG. 2, a semiconductor die and interconnected leadframe assembly are illustrated prior to enclosure within a mold cavity. Semiconductor die 202 is disposed above heatsink 128. Heatsink 128 has an external surface that is indicated by reference numeral 218. That is, external surface 218 is intended to be exposed (not encapsulated) so as to externally dissipate heat from semiconductor die 202. Heatsink 128 is insulated from leadframe assembly 100. In particular, insulating layers separate heatsink 128 from leadframe fingers 108 and 102, respectively. Leadframe fingers 108 and 102 are electrically connected to semiconductor die 202 through bond wires 216a and 216b, respectively.

Molding assembly 200 includes top plate 212 and bottom plate 214. A mold cavity is formed by closure of top plate 212 against bottom plate 214. The mold cavity is defined by inner surface 204 of top plate 212 and inner surface 206 of bottom plate 214. Tie bars 124 and 120 are extended upwardly so as to engage inner surface 204. That is, tie bars 124 and 120 are extended perpendicular to leadframe fingers 108 and 102 and away from heatsink 128. As a consequence, tie bars 124 and 120 will engage inner surface 204 once top plate 212 is closed against bottom plate 214. The mold cavity can be filled with encapsulant through passage 208 of top plate 212.

As described above, leadframe fingers 108 and 102 have corresponding lead tips 116 and 110, respectively. It should be noted that lead tips 116 and 110 are not enclosed within the mold cavity of molding assembly 200 since lead tips 116 and 110 are needed to connect semiconductor die 202 with external circuitry.

The height of tie bars 124 and 120 determines the force that will be exerted upon leadframe fingers 108 and 102. The effect of the variation of height of tie bars 124 and 120 is shown in FIGS. 3 and 4.

Figure 3:
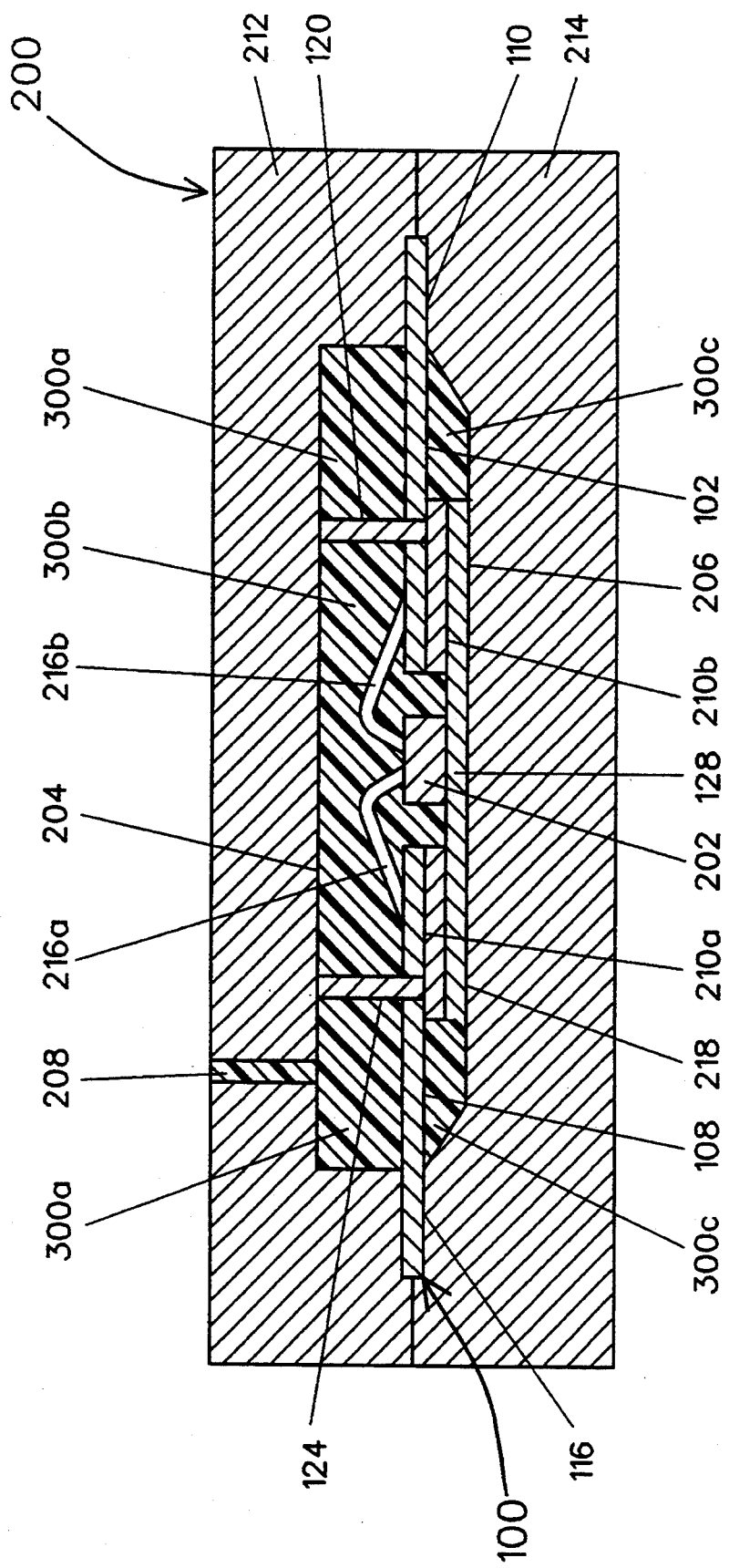
FIG. 3 illustrates a cross-sectional view of a molding assembly wherein a semiconductor die, a heatsink and a leadframe assembly are enclosed, in accordance with a preferred embodiment of the present invention.

Referring to FIG. 3, a cross-sectional view leadframe assembly 100, interconnected semiconductor die 202, and heatsink 128 enclosed within the mold cavity of molding assembly 200, is illustrated. As illustrated in FIG. 3, tie bars 124 and 120 are forced downwardly against leadframe fingers 108 and 102, respectively. In turn, leadframe fingers 108 and 102 apply a downward force to insulating layers 210a and 210b, respectively. This downward force is then ultimately applied to heatsink 128.

The end result is that external surface 218 of heatsink 128 is pressed flush against inner surface 206 of bottom plate 214. This precludes any encapsulant, which enters via passage 208, from flowing between external surface 218 and inner surface 206. Rather, entering encapsulant flows to provide encapsulant formations as indicated by reference numerals 300a–e.

Figure 4:
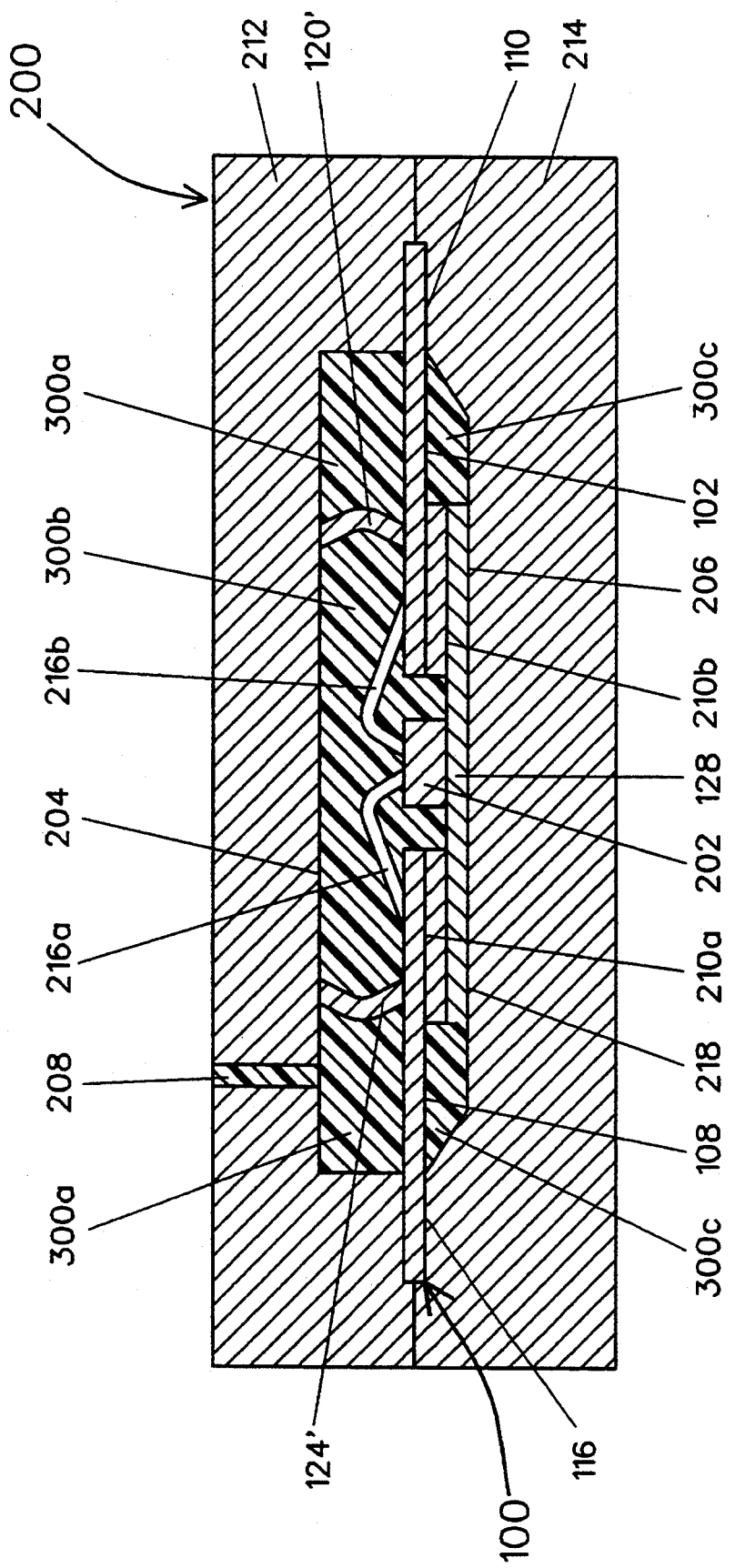
FIG. 4 illustrates the cross-sectional view of FIG. 3 with tie bar posts of an increased height that act to springingly compress the heatsink against the inner surface of a mold cavity, in accordance with a preferred embodiment of the present invention.

The downward force can be maximized by increasing the height of the tie bars 124 and 120 as illustrated in FIG. 4. Referring to FIG. 4, tie bars 124' and 120' have a height that is greater than the distance between leadframe fingers 108 and 102 and inner surface 204 when top plate 212 is closed against bottom plate 214. As a consequence, tie bars 124' and 120' are springingly compressed to provide a maximum downward force against leadframe fingers 108 and 102, respectively. Such downward force is, as described above, then ultimately applied to maintain external surface 218 of heatsink 128 in close communication with inner surface 206 of bottom plate 214. It follows that encapsulant will not infiltrate between external surface 218 and inner surface 206. Rather, encapsulant formations 300a–e are obtained.

Other advantages are also secured by the above described positioning of tie bars 124 and 120 (as well as tie bars 124' and 120'). First, heatsink 128 and semiconductor die 202 are prevented from being displaced from the interconnected leadframe assembly 100 during and after encapsulation by the forces exerted by tie bars 124 and 120. This avoids serious damage that can be inflicted when displacement occurs. Second, by avoiding reliance upon gravity and by preventing displacement of the semiconductor die 202 and heatsink 128, external surface 218 of heatsink 128 need not face downward when placed within a mold cavity. That is, the mold cavity may be positioned in any manner. This provides necessary flexibility in the assembly process of integrated circuit packages.

Figure 5:
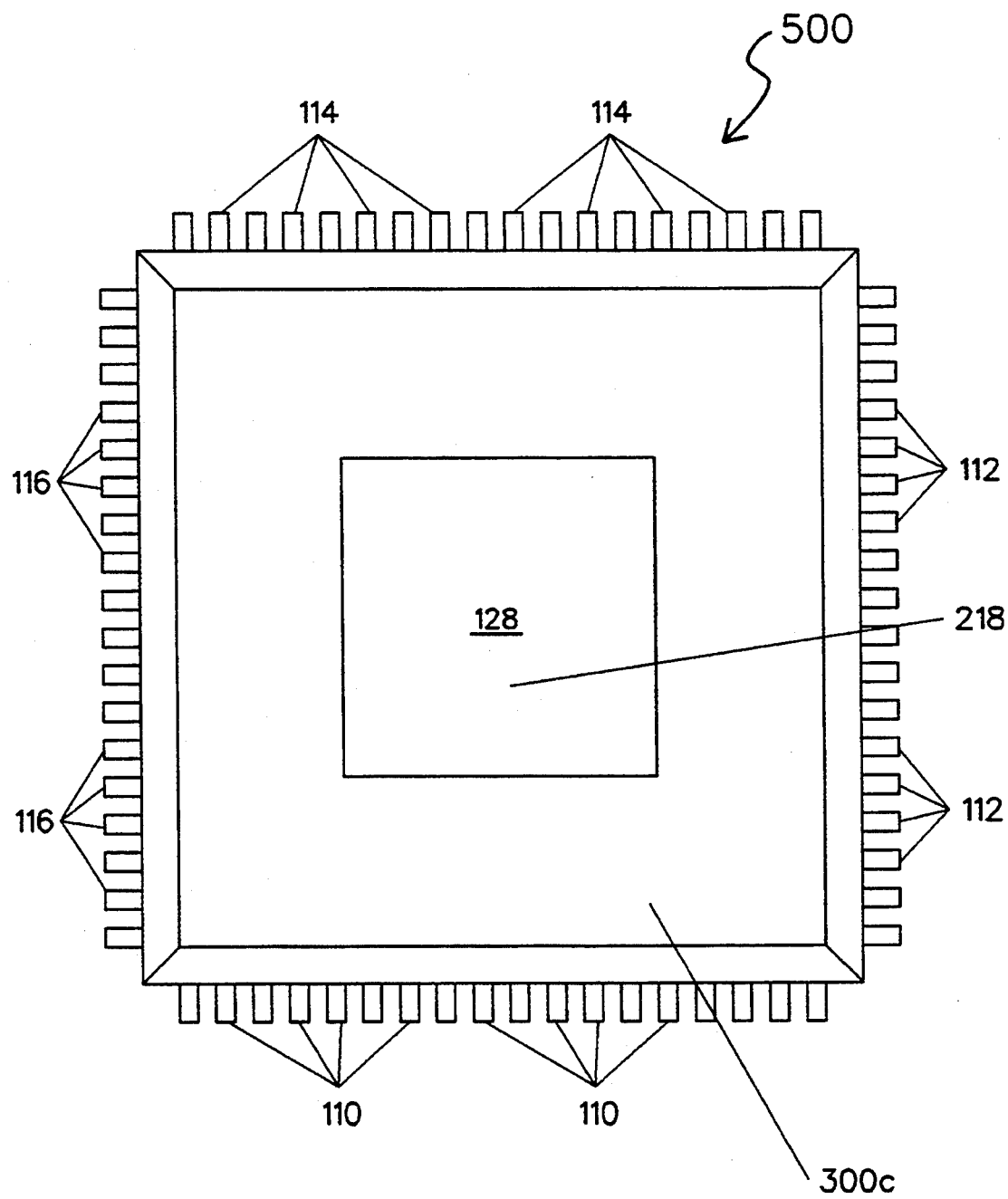
FIG. 5 illustrates an elevational view of an integrated circuit package fabricated in accordance with a preferred embodiment of the present invention.

Referring to FIG. 5, an elevational view of the integrated circuit package, fabricated in accordance with the above described preferred embodiment of the present invention, is illustrated. Encapsulant formations 300a–c, which encapsulate leadframe assembly 100, provide for integrated circuit package 500. The elevational view illustrates encapsulant formation 300c of integrated circuit package 500. Flush with encapsulant formation 300c is external surface 218 of heatsink 128. This is the result of having sufficient pressure applied to leadframe assembly 100 (as illustrated in FIGS. 1–4) of integrated circuit package 500 so as to ensure that heatsink 128 remains in close communication with inner surface 206 (as illustrated in FIGS. 2–4) of the mold cavity during the encapsulation process.

Extending from encapsulant formation 300c are lead tips 110, 112, 114, and 116. A "cavity up" design of an integrated circuit package refers to a package where the external surface of a heatsink faces away from external connections. In contrast, a "cavity up" design of an integrated circuit package refers to a package where the external surface of a heatsink faces the external connections. Accordingly, by bending lead tips 110–116 toward external surface 218 of heatsink 128, integrated circuit package 500 is of a "cavity up" design. If, however, lead tips 110–116 are bent away from external surface 218 of heatsink 128, integrated circuit package 500 can be of a "cavity down" design.

The foregoing disclosure and description of the invention are illustrative and explanatory of the preferred embodiments, and changes in the size, shape, materials and individual components, circuit elements, connections and construction may be made without departing from the spirit of the invention. In particular, the present invention may be practiced within a variety of distinct integrated circuit package types. For instance, the present invention may be practiced in conjunction with diverse types of packaging, including dual-in-line, single-in-line, small-outline, and chip-carrier type packaging, without any significant alteration. Moreover, the present invention may be practiced, without any significant alteration, through the employment of any packaging techniques including prefabricated packaging techniques.

I claim:

1. An integrated circuit package, comprising:
   (a) a heatsink having a first and second surface;
   (b) a semiconductor die in thermal communication with a portion of the first surface of said heatsink;
   (c) a leadframe assembly disposed over and substantially parallel to the first surface of said heatsink and around said semiconductor die, said leadframe assembly electrically connected to said semiconductor die, said leadframe assembly including a plurality of leadframe fingers extending into a plurality of lead tips that are adapted for connection to external circuits, said leadframe assembly further including a plurality of posts extending substantially perpendicular to and away from said first heatsink surface; and
   (d) an encapsulant enclosing said semiconductor die, said heatsink except the second surface thereof, and said leadframe assembly except for the plurality of lead tips.

2. A system for fabricating an integrated circuit package, comprising:
   (a) a mold in a closed position, said closed mold having an inside surface;
   (b) a heatsink having a first and second surface;
   (c) a semiconductor die in thermal communication with a portion of the first surface of said heatsink;
   (d) a leadframe assembly disposed over the first surface of said heatsink and around said semiconductor die, said leadframe assembly electrically connected to said semiconductor die, said leadframe assembly including a plurality of leadframe fingers extending into a plurality of lead tips that are adapted for connection to external circuits, said leadframe assembly further including a plurality of posts extending substantially perpendicular to and away from said heatsink, the plurality of posts engaging the inside surface of said closed mold;
   (e) said semiconductor die, said heatsink and said leadframe assembly, including the plurality of posts but not said plurality of lead tips, being located within said closed mold; and
   (f) a means for injecting encapsulant into said closed mold, whereby said encapsulant is substantially precluded from flowing between the inside surface of said closed mold and said heatsink.

3. The apparatus as recited in claim 2, wherein the leadframe assembly includes at least four posts.

4. The apparatus as recited in claim 2, wherein the leadframe assembly includes a plurality of tie bars from which the plurality of posts are formed.

5. The apparatus as recited in claim 2, wherein the plurality of posts extend beyond the inside surface of the mold so that the plurality of posts are springingly compressed when the mold is closed.

* * * * *